(12) United States Patent
Franco

(10) Patent No.: US 12,512,250 B2
(45) Date of Patent: Dec. 30, 2025

(54) CONDUCTIVE NODE INDUCTION APPARATUS

(71) Applicant: Micron Technology, Inc., Boise, ID (US)

(72) Inventor: Carlos Franco, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 714 days.

(21) Appl. No.: 17/895,966

(22) Filed: Aug. 25, 2022

(65) Prior Publication Data

US 2024/0071679 A1   Feb. 29, 2024

(51) Int. Cl.
    *H01F 27/28* (2006.01)
    *H01F 41/04* (2006.01)

(52) U.S. Cl.
    CPC .............. *H01F 27/28* (2013.01); *H01F 41/04* (2013.01)

(58) Field of Classification Search
    CPC .......... H01F 27/28; H01F 41/04; H01F 27/34; H01F 17/0013; H01F 2017/0073; H01F 27/2804; H01F 27/2823
    See application file for complete search history.

(56) References Cited

U.S. PATENT DOCUMENTS

| | | |
|---|---|---|
| 3,157,810 A | 11/1964 | Adkins |
| 6,198,375 B1 | 3/2001 | Shafer |
| 6,204,744 B1 | 3/2001 | Shafer et al. |
| 7,868,727 B2 * | 1/2011 | Chen .................... H01F 17/0013 336/200 |
| 8,686,821 B2 * | 4/2014 | Chang ................. H01F 17/0013 336/147 |
| 2003/0005569 A1 * | 1/2003 | Hiatt .................... H01F 17/0033 29/852 |
| 2007/0236319 A1 * | 10/2007 | Hsu ..................... H01F 17/0013 336/200 |

(Continued)

OTHER PUBLICATIONS

Lyengar, et al., "A DC/DC boost converter toward fully on-chip integration using new micromachined planar inductors", 30th Annual IEEE Power Electronics Specialists Conference, vol. 1, 1999, pp. 72-76.

(Continued)

*Primary Examiner* — Mang Tin Bik Lian
(74) *Attorney, Agent, or Firm* — Brooks, Cameron & Huebsch, PLLC

(57) ABSTRACT

Systems, methods, and apparatus are provided for a conductive node induction apparatus. A particular induction apparatus can include a first plurality of conductive nodes that include a corresponding first edge and second edge, a second plurality of conductive nodes that include a corresponding first edge and second edge, wherein the first plurality of conductive nodes are separated from the second plurality of conductive nodes by a space, a first conductive trace coupled to a first edge a first conductive node of the first plurality of conductive nodes and coupled to a second edge of a first conductive node of the second plurality of conductive nodes, and a second conductive trace coupled to a first edge of the first conductive node of the second plurality of conductive nodes and coupled to a second edge of a second conductive node of the first plurality of conductive nodes.

17 Claims, 5 Drawing Sheets

(56) References Cited

U.S. PATENT DOCUMENTS

| | | | |
|---|---|---|---|
| 2007/0296534 A1* | 12/2007 | Carastro | H01P 11/007 |
| | | | 336/200 |
| 2008/0297299 A1* | 12/2008 | Yun | H01F 17/0013 |
| | | | 336/200 |
| 2011/0050334 A1* | 3/2011 | Pan | H02M 3/003 |
| | | | 327/540 |
| 2016/0293544 A1* | 10/2016 | Yen | H01F 27/2804 |
| 2018/0190635 A1* | 7/2018 | Choi | H01L 23/5386 |
| 2020/0286660 A1* | 9/2020 | Kamgaing | H01L 24/16 |
| 2020/0312766 A1* | 10/2020 | Bhagavat | H01L 23/5383 |
| 2021/0014972 A1* | 1/2021 | Marin | H01L 24/13 |
| 2023/0096368 A1* | 3/2023 | Aleksov | H01L 21/4857 |
| | | | 257/531 |

OTHER PUBLICATIONS

Ammouri, et al., "Experimental analysis of planar spiral inductors", 2014 International Conference on Electrical Sciences and Technologies in Maghreb, 2014, pp. 1-5.

Sankarasubramanian, et al. "Magnetic Inductor Arrays for Intel® Fully Integrated Voltage Regulator (FIVR) on 10th generation Intel® Core™ SoCs", 2020 IEEE 70th Electronic Components and Technology Conference (ECTC), 2020, pp. 399-404.

Lopez-Villegas, et al. "Toroidal versus spiral inductors in multilayered technologies", 2016 IEEE Radio Frequency Integrated Circuits Symposium (RFIC), 2016, pp. 55-58.

* cited by examiner

```
                                                            ┌─ 470
                                                           ╱

┌──────────────────────────────────────────────────────────────────┐
│ FORM A FIRST SET OF CONDUCTIVE NODES THAT INCLUDE A FIRST        │
│ CONDUCTIVE SURFACE AND A SECOND CONDUCTIVE SURFACE THAT IS       │─472
│ OPPOSITE TO THE FIRST CONDUCTIVE SURFACE                         │
└──────────────────────────────────────────────────────────────────┘
                              │
┌──────────────────────────────────────────────────────────────────┐
│ FORM A SECOND SET OF CONDUCTIVE NODES PARALLEL TO THE FIRST SET  │
│ OF CONDUCTIVE NODES, WHEREIN THE SECOND SET OF CONDUCTIVE NODES  │─474
│ INCLUDE A THIRD CONDUCTIVE SURFACE AND A FOURTH CONDUCTIVE       │
│ SURFACE THAT IS OPPOSITE THE THIRD CONDUCTIVE SURFACE            │
└──────────────────────────────────────────────────────────────────┘

┌──────────────────────────────────────────────────────────────────┐
│ FORM A FIRST SET OF CONDUCTIVE TRACES THAT CONNECT THE FIRST     │
│ CONDUCTIVE SURFACE OF THE FIRST SET OF CONDUCTIVE NODES TO A     │─476
│ CORRESPONDING FOURTH CONDUCTIVE SURFACE OF THE SECOND SET OF     │
│ CONDUCTIVE NODES                                                 │
└──────────────────────────────────────────────────────────────────┘

┌──────────────────────────────────────────────────────────────────┐
│ FORM A SECOND SET OF CONDUCTIVE TRACES THAT CONNECT THE SECOND   │
│ CONDUCTIVE SURFACE OF THE FIRST SET OF CONDUCTIVE NODES TO A     │─478
│ CORRESPONDING THIRD CONDUCTIVE SURFACE OF THE SECOND SET OF      │
│ CONDUCTIVE NODES                                                 │
└──────────────────────────────────────────────────────────────────┘

┌──────────────────────────────────────────────────────────────────┐
│ PROVIDE CURRENT THROUGH THE FIRST SET OF CONDUCTIVE TRACES AND   │
│ THE SECOND SET OF CONDUCTIVE TRACES TO GENERATE AN INDUCTANCE    │─480
│ BETWEEN THE FIRST SET OF CONDUCTIVE NODES AND THE SECOND SET OF  │
│ CONDUCTIVE NODES                                                 │
└──────────────────────────────────────────────────────────────────┘
```

FIG. 4

CONDUCTIVE NODE INDUCTION APPARATUS

TECHNICAL FIELD

The present disclosure relates generally to integrated circuits, and more particularly to a conductive node induction apparatus.

BACKGROUND

A memory system can include digital logic and an associated power supply, voltage control, and clock control. In general, the power supply, voltage control, and/or clock control can change a voltage or frequency during operation of the digital logic. Voltage converters can be utilized to alter an input voltage to an output voltage that is different than the input voltage. Some voltage converters can utilize an inductor.

BRIEF DESCRIPTION OF THE DRAWINGS

FIG. 4 is a flow diagram corresponding to a method for forming a conductive node induction apparatus in accordance with a number of embodiments of the present disclosure.

DETAILED DESCRIPTION

Figure 1:
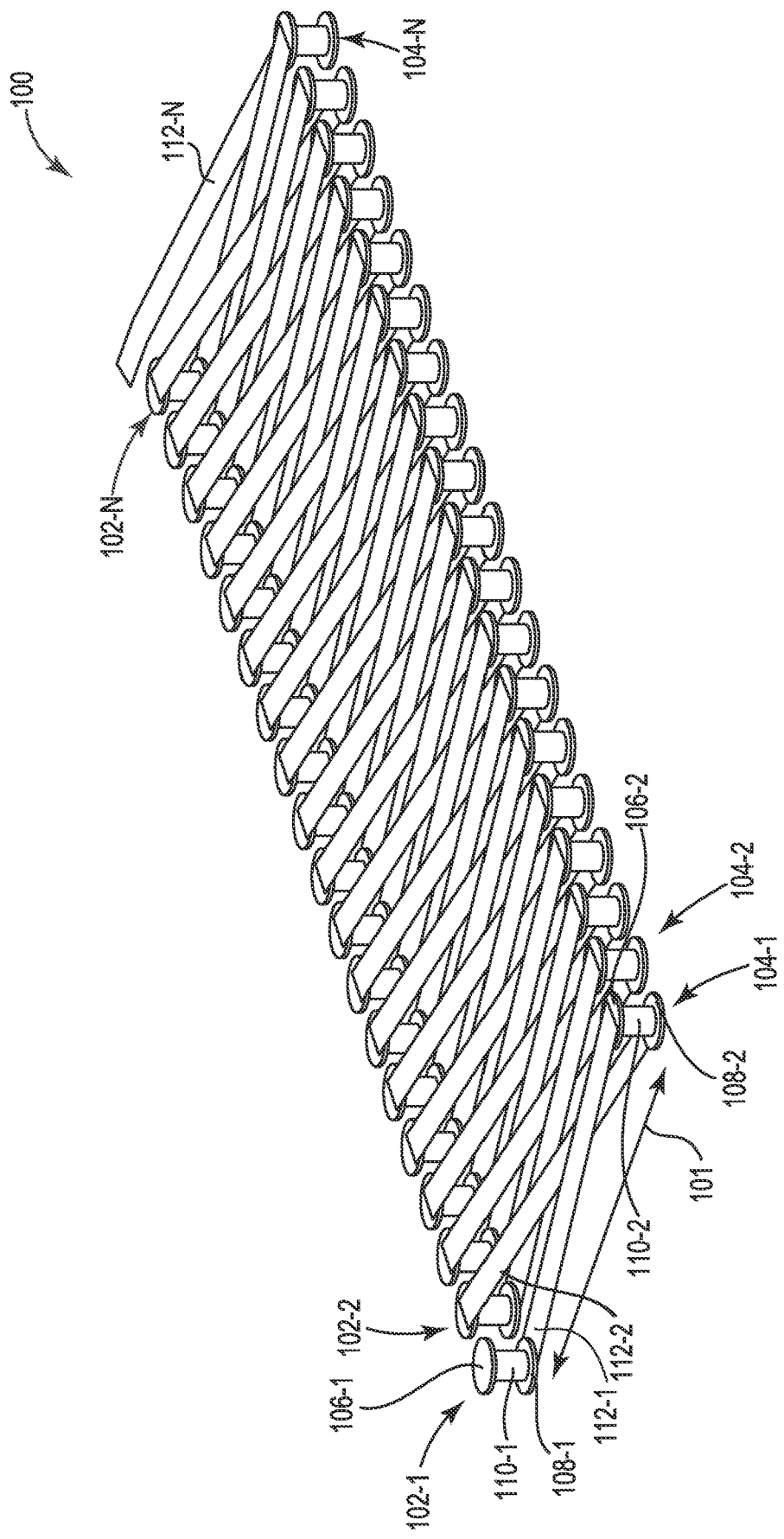
FIG. 1 illustrates a conductive node induction apparatus in accordance with a number of embodiments of the present disclosure.

Embodiments of the present disclosure describe a conductive node induction apparatus. The conductive node induction apparatus can be used in an integrated circuit, for instance. The conductive node induction apparatus can be utilized with a direct current to direct current (DC/DC) boost converter for a memory device. A DC/DC boost converter can be a power converter that steps up voltage while stepping down current from an input supply to an output. In some embodiments the memory device can utilize a DC/DC boost converter to improve efficiency of increasing the voltage compared to utilizing a charge pump.

Utilizing a DC/DC boost converter can be disadvantageous when utilized with a memory device due to particular size restrictions of the memory device and the utilization of an inductor (e.g., induction apparatus, etc.). For example, the induction apparatus may be restricted to a particular size when utilized with a NAND type memory device. Although embodiments of utilizing the conductive node induction apparatus as part of a DC/DC boost converter are described herein, the present disclosure is not so limited. For example, the conductive node induction apparatus described herein can be utilized with other types of systems and circuits that utilize induction to oppose a change of current.

In some embodiments, when a DC/DC boost converter is utilized for a memory device, the components of the DC/DC boost converter, such as an induction apparatus, can be implemented within a packaging substrate of the memory device. The packaging substrate of the memory device can be utilized to protect the integrated circuits or other components of the memory device. In some embodiments, the component size restrictions can be further restricted when implementing or embedding the components within the packaging substrate. The size restrictions of the induction apparatus can lower the output voltage of the DC/DC boost converter when utilizing a traditional induction apparatus, such as a square induction device. That is, decreasing the size or physical dimensions of a traditional induction device can lower the output voltage to a level that is below a target voltage for the memory device. In this way, the design parameters of a traditional induction device may not be usable when the induction device is an on-chip inductor, an on-interposer inductor, and/or an on-board inductor.

The present disclosure addresses several issues present in some traditional induction devices. With traditional spiral induction devices (e.g., square inductors, etc.) a conductive line can be routed in a square or spiral shape surrounding a core. In this way, a voltage can be provided to the induction device to generate a magnetic field which can resist a current change. This resistance to current change can allow for the DC/DC boost converter to alter an input voltage to an increased output voltage. However, the inductance provided by the spiral induction devices or other previous types of planar induction devices may not be high enough or may have a Q-factor below a threshold Q-factor for the memory device when the overall size of the induction device is reduced. As will be appreciated, the term "Q-factor" generally refers to the ratio of the inductive resistance to the resistance for an inductor (e.g., the conductive node induction system described here) at a given frequency. For example, the thickness of the conductive lines may be limited due to height restrictions and the quantity of spirals around a core can be limited due to area restrictions.

In contrast to the traditional induction coil devices previously discussed, the conductive node induction apparatus of the present disclosure can be used within smaller special restrictions while still providing greater inductance and a greater Q-factor than the traditional induction devices. The conductive node induction apparatus is a coreless induction apparatus that utilizes a first plurality of conductive nodes that are aligned parallel to a second plurality of conductive nodes. In these embodiments, the first and second plurality of conductive nodes each include a first conductive edge (e.g., top edge, etc.) and a second conductive edge (e.g., bottom edge, etc.). In these embodiments, conductive traces can connect a first conductive edge of a first conductive node of the first plurality to a second conductive edge of a second conductive node of the second plurality. This can be continued along the first plurality of conductive nodes and the second plurality of conductive nodes to generate a conductive node induction apparatus formed by the coil generated between the first plurality of conductive nodes and the second plurality of conductive nodes by the conductive traces. The conductive node apparatus can provide parasitic capacitance above 1 gigahertz and a Q-factor above 5 when utilizing a switching frequency at or near 50 megahertz.

FIG. 1 illustrates a conductive node induction apparatus 100 in accordance with a number of embodiments of the present disclosure. The conductive node induction apparatus 100 can be a planar inductor. The conductive node induction apparatus 100 can be utilized to generate inductance when a voltage is applied to the conductive node induction apparatus 100. As described herein, inductance is the ratio of the voltage to the rate of change of current. Inductance can be utilized by a DC/DC boost converter to convert an input voltage to a greater output voltage. Although a DC/DC boost converter is used as a specific example for utilizing the conductive node induction apparatus 100, this disclosure is not so limited. That is, the conductive node induction apparatus 100 can be utilized by other devices or systems that utilize traditional inductor devices.

The conductive node induction apparatus 100 can include a first plurality of conductive nodes 102-1, 102-2, 102-N (collectively referred to herein as the first plurality of conductive nodes 102). In addition, the conductive node induction apparatus 100 includes a second plurality of conductive nodes 104-1, 104-2, 104-N (collectively referred to herein as the second plurality of conductive nodes 104). In some embodiments, the first plurality of conductive nodes 102 can be separated from the second plurality of conductive nodes 104 by a space 101. The space 101 can be utilized as a conductive separation between the first plurality of conductive nodes 102 and the second plurality of conductive nodes 104. In a specific example, the space 101 can be between approximately 1 millimeter (mm) and 2 mm, although other distances for the space 101 can also be utilized.

In some embodiments, the first plurality of conductive nodes 102 can be substantially parallel to the second plurality of conductive nodes 104 with the space 101 being maintained between the first plurality of conductive nodes 102 and the second plurality of conductive nodes 104. In this way, the distance of the space 101 can be maintained from the first end of the conductive node induction apparatus 100 to the second end of the conductive node induction apparatus 100. As used herein, the term "substantially" intends that the characteristic need not be absolute, but is close enough so as to achieve the advantages of the characteristic. For example, "substantially parallel" is not limited to characteristics that are absolutely parallel and can include characteristics that are intended to be parallel but due to manufacturing limitations may not be precisely parallel.

The first plurality of conductive nodes 102 can each include a first conductive edge 106-1 and a second conductive edge 108-1. The first conductive edge 106-1 can be coupled to the second conductive edge 108-1 by an interior portion 110-1. In these embodiments, the interior portion 110-1 can be a conductive material with a first diameter. The first conductive edge 106-1 can be coupled to a first side of the interior portion 110-1 and the second conductive edge 108-1 can be coupled to a second side of the interior portion 110-1. In these embodiments, the first conductive edge 106-1 and the second conductive edge 106-2 can have a second diameter that is larger than the first diameter of the interior portion 110-1. In this way, the first conductive edge 106-1 and the second conductive edge 108-1 can be surfaces that can be utilized to be coupled to conductive traces 112-1, 112-2, 112-N (collectively referred to as conductive traces 112).

In some embodiments, the conductive traces 112 cross the space 101 between the first plurality of conductive nodes 102 and the second plurality of conductive nodes 104. In some embodiments, the conductive traces 112 can have a width that is less than 100 micrometers. In a specific example, the conductive traces 112 can have a width that is approximately 65 micrometers. In these embodiments, the space 101 can be a distance between 1.0 millimeters and 2.0 millimeters. In a specific example, the space 101 can be 1.3 millimeters.

In a similar way, the second plurality of conductive nodes 104 can each include a corresponding first conductive edge 106-2, second conductive edge 108-2, and interior portion 110-2. In this way, the first plurality of conductive nodes 102 can be coupled to the second plurality of conductive nodes by utilizing the conductive traces 112. In some embodiments, the first conductive edges 106-1 of the first plurality of conductive nodes 102 can be coupled to corresponding second conductive edges 108-2 of the second plurality of conductive nodes 104. In a similar way, the second conductive edges 108-1 of the first plurality of conductive nodes 102 can be coupled to the corresponding first conductive edges 106-2 of the second plurality of conductive nodes 104.

The conductive traces 112 can be a conductive material such as, but not limited to a copper material. In some embodiments, the conductive traces 112 can be a copper material to carry an electrical current from the first plurality of conductive nodes 102 to the second plurality of conductive nodes 104 and back to the first plurality of conductive nodes 102. In this way, the electrical current can flow through a coil created by the first plurality of conductive nodes 102, second plurality of conductive nodes 104, and conductive traces 112. In some embodiments, the conductive traces 112 can be a copper material that includes a width or thickness that is approximately between 50 micrometers and 100 micrometers. In a specific example, the conductive traces 112 are a copper material that includes a width that is approximately 65 micrometers.

In a specific embodiment, a first end of a first conductive trace 112-1 can be coupled to the first conductive edge 106-1 of a first conductive node 102-1 of the first plurality of conductive nodes 102 and a second end of the first conductive trace 112-1 can be coupled to a second conductive edge 108-2 of a first conductive node 104-1 of the second plurality of conductive nodes 104. In this specific embodiment, a first end of a second conductive trace 112-2 can be coupled to a first conductive end 106-2 of the first conductive node 104-1 of the second plurality of conductive nodes 104 and a second end of the second conductive trace 112-2 can be coupled to a second conductive end 108-1 of a second conductive node 102-2 of the plurality of conductive nodes 102.

In this way, the conductive traces 112 can be utilized to connect a conductive edge of a single conductive node from the first plurality of conductive nodes 102 to an inverse conductive edge of a single conductive node from the second plurality of conductive nodes 104. In this way, each of the first plurality of conductive nodes 102 include a conductive trace 112 to connect a first conductive edge 106 to an inverse conductive edge (e.g., second conductive edge 108) of a corresponding conductive node of the second plurality of conductive nodes 104.

In some embodiments, at least a portion of the first conductive trace 112-1 can intersect at least a portion of the second conductive trace 112-2 through the space 101. For example, a portion of a particular conductive trace can be positioned over a different conductive trace within the space 101. In some embodiments, the plurality of conductive traces 112 include a space above or below an intersecting conductive trace to prevent electrical current from passing from a first conductive trace to a second conductive trace within the space 101.

In a specific example, the conductive node induction apparatus 100 can include a first plurality of conductive nodes 102 that include a corresponding first conductive edge 106-1 and second conductive edge 108-1, a second plurality of conductive nodes 104 that include a corresponding first conductive edge 106-2 and second conductive edge 108-2. In this example, the first plurality of conductive nodes 102 are separated from the second plurality of conductive nodes 104 by a space 101. This specific example can include a first conductive trace 112-1 coupled to a first conductive edge 106-1 of a first conductive node 102-1 of the first plurality of conductive nodes 102 and coupled to a second conductive edge 108-2 of a first conductive node 104-1 of the second plurality of conductive nodes 104. In this example, a second conductive trace 112-2 can be coupled to a first conductive edge 106-2 of the first conductive node 104-1 of the second plurality of conductive nodes 104 and coupled to a second conductive edge 108-2 of a second conductive node 102-2 of the first plurality of conductive nodes 102.

As described herein, the conductive node induction apparatus 100 is a coreless induction apparatus. In traditional induction devices, a metal core can be utilized as an interior element where the conductive traces are wrapped around to create the coil that creates the inductance. The planer and coreless design utilized by the conductive node induction apparatus 100 can reduce the footprint and/or overall dimensions occupied by the conductive node induction apparatus 100 while providing an increased inductance and increased Q-factor compared to traditional induction devices that are restricted to a similar footprint.

Figure 2:
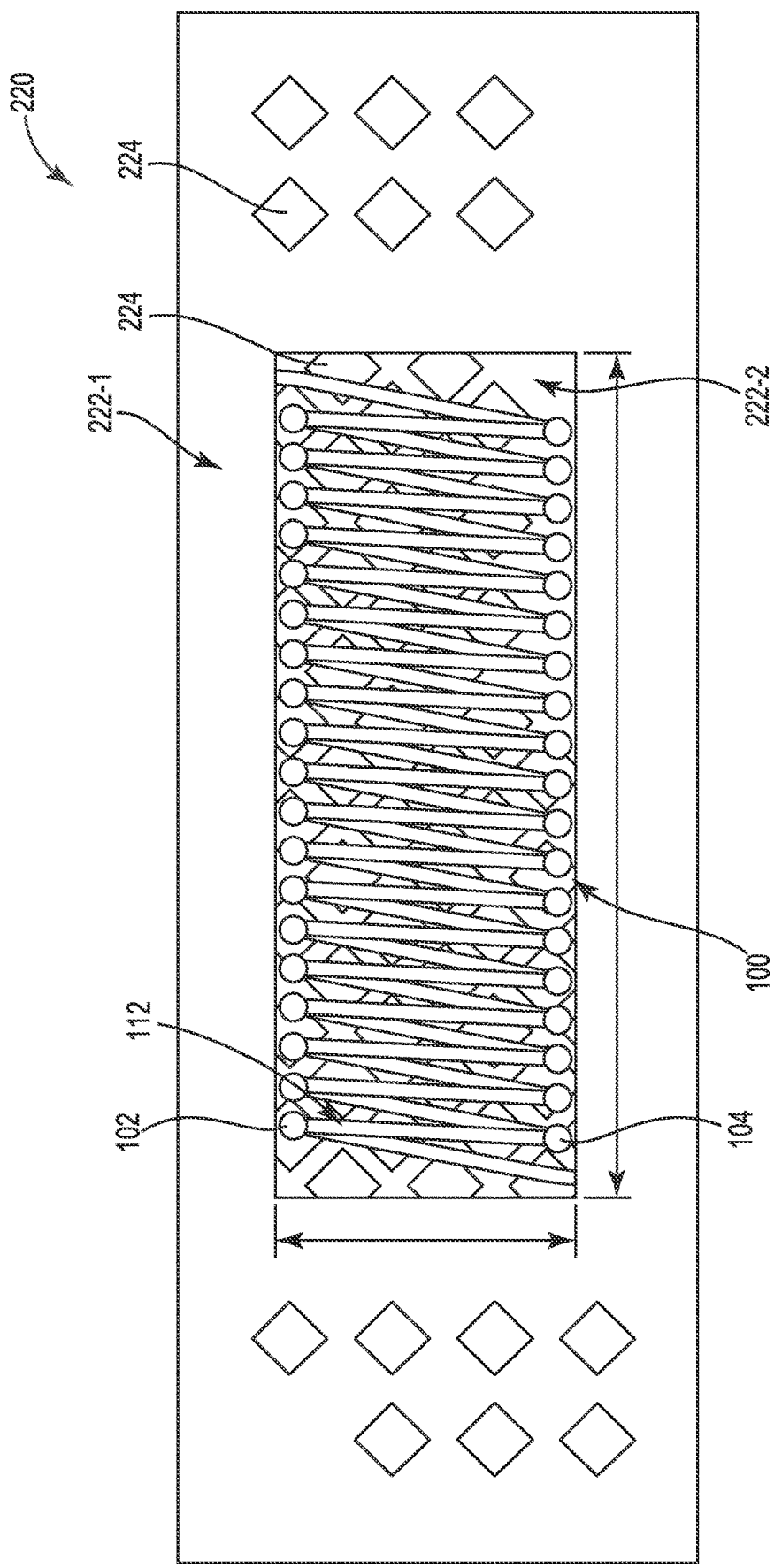
FIG. 2 illustrates a conductive node induction system in accordance with a number of embodiments of the present disclosure.

FIG. 2 illustrates a conductive node induction system 220 in accordance with a number of embodiments of the present disclosure. In some embodiments, the system 220 illustrates the conductive node induction apparatus 100 embedded between a first layer 222-1 of a packaging substrate and a second layer 222-2 of the packaging substrate. FIG. 2 illustrates a removed portion of the first layer 222-1 to more easily illustrate the conductive node induction apparatus 100. FIG. 2 illustrates the conductive node induction apparatus 100 from a top view. For example, the conductive node induction apparatus 100 can be illustrated from a top view such that the top conductive edges of the first plurality of conductive nodes 102 and the top conductive edges of the second plurality of conductive nodes 104 are illustrated.

As illustrated in FIG. 2, the conductive node induction apparatus 100 can include a first plurality of conductive nodes 102 aligned across from a second plurality of conductive nodes 104. The first plurality of conductive nodes 102 can be coupled to the second plurality of conductive nodes 104 by a plurality of conductive traces 112. As described herein, the plurality of conductive traces 112 can connect a first conductive edge of the first plurality of conductive nodes 102 to a second conductive edge of the second plurality of conductive nodes 104. In addition, the plurality of conductive traces 112 can connect the second conductive edge of the first plurality of conductive nodes 102 to the first conductive edge of the second plurality of conductive nodes 104. In this way, the plurality of conductive traces 112 can connect inverse conductive edges of the first plurality of conductive nodes 102 and the second plurality of conductive nodes 104 to form a coil that is utilized as the conductive node induction apparatus 100.

The first layer 222-1 and/or the second layer 222-2 of the packaging substrate can be a metal material that can be utilized as an electrical ground for the system 220. For example, the first layer 222-1 and the second layer 222-2 of the packaging substrate can be a copper material that can be an electrical ground for the system 220. In some embodiments, the first layer 222-1 can be aligned parallel or substantially parallel to a first conductive edge of the first plurality of conductive nodes 102 and the first conductive edge of the second plurality of conductive nodes 104. In a similar way, the second layer 222-2 can be aligned parallel or substantially parallel to the second conductive edge of the first plurality of conductive nodes 102 and the second conductive edge of the second plurality of conductive nodes 104. That is, the conductive node induction apparatus 100 can be positioned between the first layer 222-1 and the second layer 222-2 of the packaging substrate.

In some embodiments, the first layer 222-1 and the second layer 222-2 of the packaging substrate can include a plurality of apertures 224. The apertures 224 can be cut-out or removed portions of the material of the first layer 222-1 and the second layer 222-2. In some embodiments, the plurality of apertures 224 can be a particular shape (e.g., circle, triangle, diamond, etc.). In some embodiments, the plurality of apertures 224 can reduce electromagnetic interference (EMI) radiation generated by the conductive node induction apparatus 100. In these embodiments, the EMI radiation can be unwanted noise that can be generated by the conductive node induction apparatus 100. In some embodiments, the plurality of apertures 224 can reduce capacitive parasitic effects associated with operation of the conductive node induction apparatus 100.

Figure 3:
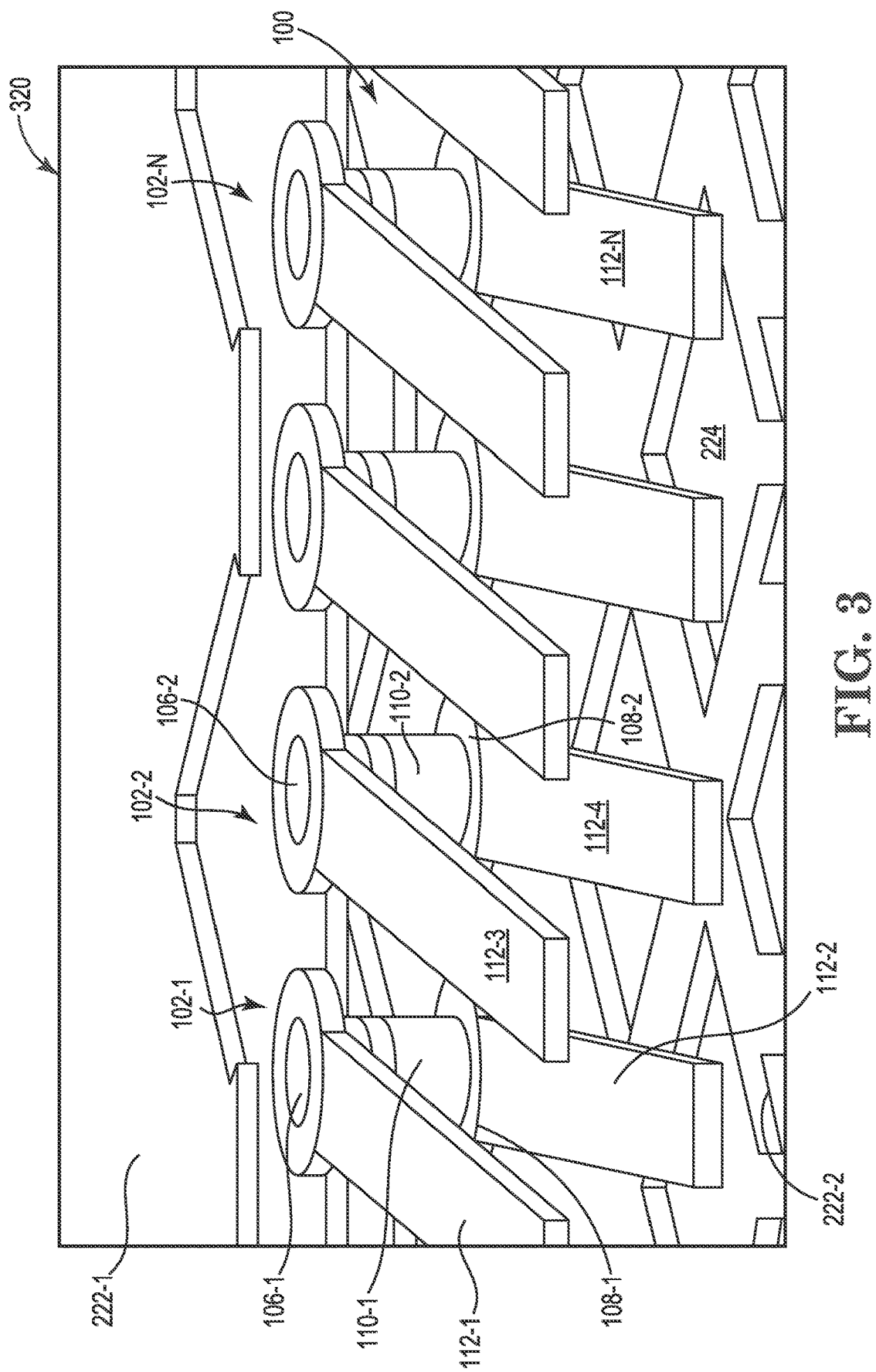
FIG. 3 illustrates a portion of a conductive node induction system in accordance with a number of embodiments of the present disclosure.

FIG. 3 illustrates a portion of a conductive node induction system 324 in accordance with a number of embodiments of the present disclosure. FIG. 3 illustrates a side view of the first plurality conductive nodes 102-1, 102-2, 102-N. The first plurality of conductive nodes 102-1, 102-2, 102-N can be positioned between a first layer 222-1 and a second layer 222-2 of a packaging substrate. As described herein, the first layer 222-1 and the second layer 222-2 of the packaging substrate can include apertures 224.

As described herein, the first conductive node 102-1 can include a first conductive edge 106-1, a second conductive edge 108-1, and an interior portion 110-1. A first conductive trace 112-1 can be coupled to the first conductive edge 106-1 and a second conductive edge (not illustrated) of a corresponding conductive node of a second plurality of conductive nodes. As described herein, the conductive trace 112-1 can be electrically coupled to the first conductive edge 106-1 such that electrical current can pass from the first conductive trace 112-1 to the first conductive edge 106-1. In addition, a second conductive trace 112-2 can be coupled to the second conductive edge 108-1 of the first conductive node 102-1 and coupled to first conductive edge (not illustrated) of a corresponding conductive node of the second plurality of conductive nodes.

In these examples, a third conductive trace 112-3 can be coupled to the first conductive edge 106-2 of the second conductive node 102-2 and a second conductive edge (not illustrated) of a corresponding conductive node of the second plurality of conductive nodes. In addition, a fourth conductive trace 112-4 can be coupled to the second conductive edge 108-2 of the second conductive node 102-2 and a first conductive edge (not illustrated) of a corresponding conductive node of the second plurality of conductive nodes. In this way, the plurality of conductive traces 112-1, 112-2, 112-3, 112-4, 112-N can generate a coil between the first plurality of conductive nodes 102 and the second plurality of conductive nodes.

FIG. 4 is a flow diagram corresponding to a method 470 for forming a conductive node induction apparatus in accordance with a number of embodiments of the present disclosure. In some embodiments, the method 470 can be utilized to generate a conductive node induction apparatus 100 as referenced in FIG. 1, a conductive node induction system 220 as referenced in FIG. 2, and/or a conductive node induction system 320 as referenced in FIG. 3. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At 472, the method 470 can include forming a first set of conductive nodes that include a first conductive surface and a second conductive surface that is opposite to the first conductive surface. In some embodiments, a first conductive surface can be a first conductive edge and the second conductive surface can be a second conductive edge. As described herein, the first set of conductive nodes can be formed of an electrically conductive material such as, but not limited to a copper material. In some embodiments, the first set of conductive nodes can be formed as a cylindrical shaped interior portion that includes a cylindrical first conductive surface and cylindrical second conductive surface. In these embodiments, the interior cylindrical shape can have a first diameter and the first and second conductive surfaces can have a second diameter that is greater than the first diameter.

At 474, the method 470 can include forming a second set of conductive nodes parallel to the first set of conductive nodes, wherein the second set of conductive nodes include a third conductive surface and a fourth conductive surface that is opposite the third conductive surface. As described herein, the second set of conductive nodes can be the same size and shape as the first set of conductive nodes. In some embodiments, the second set of conductive nodes can be aligned a particular distance from the first set of conductive nodes. In these embodiments, the first set of conductive nodes can be positioned along a first line and the second set of conductive nodes can be positioned along a second line that is substantially parallel to the first line.

In some embodiments, the first conductive surface and the third conductive surface can be on a first edge of the conductive node induction apparatus and the second conductive surface, and the fourth conductive surface can be on a second edge of the conductive node induction apparatus. In this way, the first conductive surface and the third conductive surface can be on the same side or edge, and the second conductive surface and the fourth conductive surface can be on the same side or edge of the conductive node induction apparatus.

In some embodiments, a quantity of the first set of conductive nodes and the second set of conductive nodes can be based on a length of space available for the conductive node induction apparatus within the packaging substrate of the memory resource. As described herein, the physical dimensions allowed for an induction apparatus can be limited to a particular length and width. In these embodiments, the quantity of conductive nodes can be based on the length dimension allowed and the space between the first set of conductive nodes and the second set of conductive nodes can be based on the width dimension allowed.

In some embodiments, the method 470 can include forming the second set of conductive nodes by forming the third conductive surface at substantially the same height as the first conductive surface of the first set of conductive nodes and forming the fourth conductive surface at substantially the same height as the second conductive surface of the first set of conductive nodes. In this way, a coil can be formed when the conductive traces are formed to couple the first set of conductive nodes to the second set of conductive nodes.

At 476, the method 470 can include forming a first set of conductive traces that connect the first conductive surface of the first set of conductive nodes to a corresponding fourth conductive surface of the second set of conductive nodes. As described herein, the first conductive surface and the fourth conductive surface can be on an opposite side of the conductive nodes. For example, the first conductive surface can be referred to as a top conductive surface and the fourth conductive surface can be referred to as a bottom conductive surface. In this way, the first conductive surface can be on an opposite side as the fourth conductive surface. In this way, the conductive trace can move from a top surface of a first conductive node to a bottom surface of a second conductive node.

In some embodiments, forming the first set of conductive nodes includes forming the first conductive surface with a first diameter, forming the second conductive surface with the first diameter, and forming a conductive connection between the first conductive surface and the second conductive surface with a second diameter that is smaller than the first diameter. In some embodiments, the conductive connection can be an interior portion of the conductive node that provides an electrical connection between the first conductive surface and the second conductive surface.

At 478, the method 470 can include forming a second set of conductive traces that connect the second conductive surface of the first set of conductive nodes to a corresponding third conductive surface of the second set of conductive nodes. The second set of conductive traces can connect the second conductive surface to a corresponding third conductive surface. In a similar way to the first set of conductive traces, the second set of conductive traces can connect a bottom conductive surface to a top conductive surface. In this way, the conductive traces can form a coil for a current to pass through the first set of conductive nodes, through the first set of conductive traces, through the second set of conductive nodes, and then through the second set of conductive traces. This current path can continue until the final conductive node is reached or the final conductive trace is reached.

At 480, the method 470 can include providing current through the first set of conductive traces and the second set of conductive traces to generate an inductance between the first set of conductive nodes and the second set of conductive nodes. As described herein, an electrical current can be provided to pass through the coil generated by the first set of conductive traces and the second set of conductive traces. The current flowing through the coil can generate an inductance as described herein. That is, the method 470 can include forming a conductive coil with the first set of conductive traces and the second set of conductive traces between a first height of the first set of conductive nodes and a second height of the second set of conductive nodes.

In some embodiments, the method 470 includes forming a ground layer parallel to the first conductive surface of the first set of conductive nodes and the third conductive surface of the second set of conductive nodes. In some embodiments, the ground layer can be the first layer 222-1 or the second layer 222-2 of the packaging substrate as illustrated in FIG. 2. In these embodiments, the method 470 can also include forming a plurality of apertures within the ground layer. As described herein, the plurality of apertures can reduce electromagnetic induction (EMI) radiation of the induction apparatus.

Figure 5:
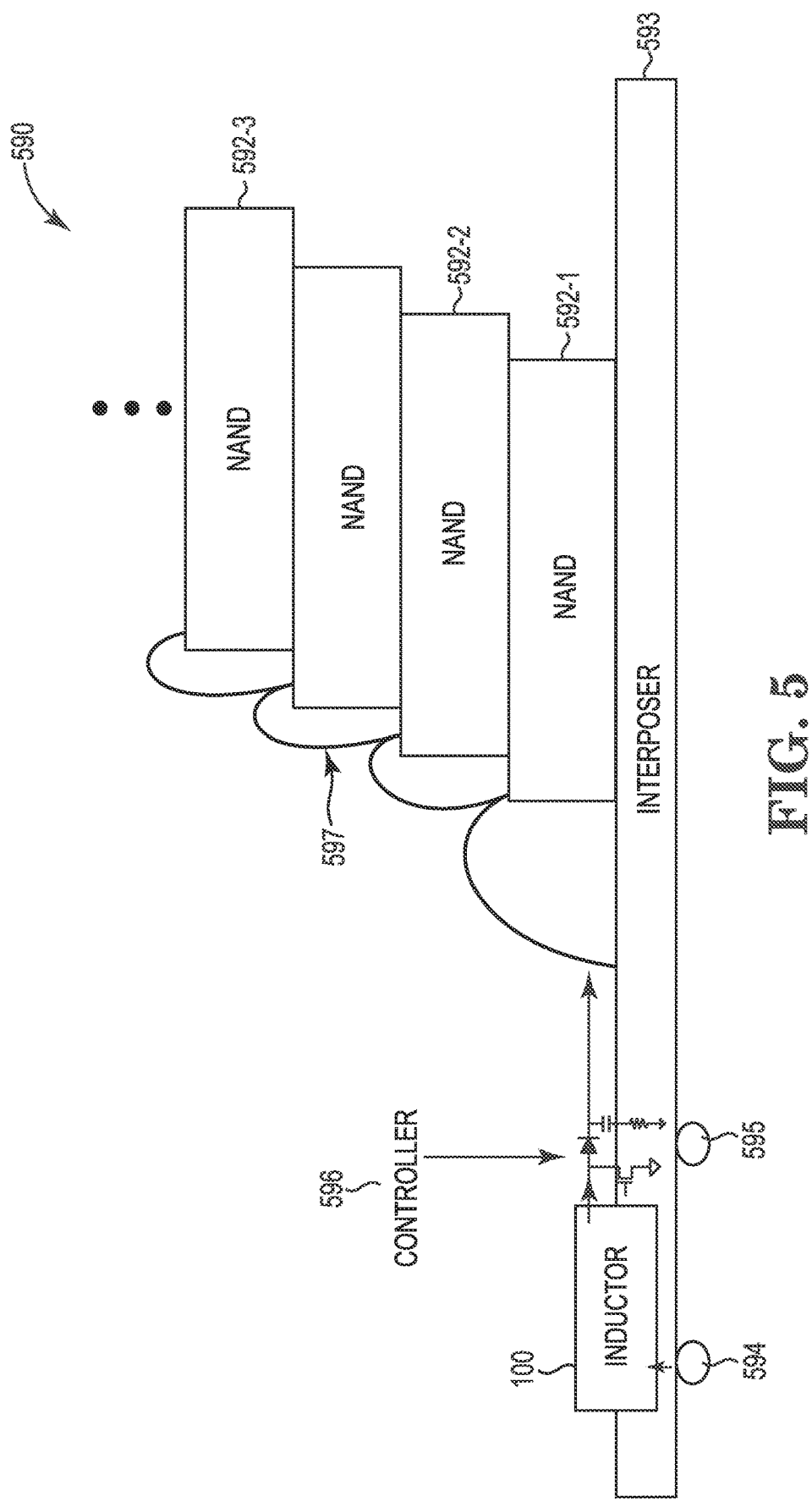
FIG. 5 illustrates a memory system utilizing a conductive node induction apparatus in accordance with a number of embodiments of the present disclosure.

FIG. 5 illustrates a memory system 590 utilizing a conductive node induction apparatus 100 in accordance with a number of embodiments of the present disclosure. As described herein, the conductive node induction apparatus 100 can be utilized by a boost converter 594 that can be utilized by a memory device. The memory system 590 can include a dynamic random access memory (DRAM) 591, a negative-and (NAND) memory device 592, and an interposer 593. As used herein, an interposer 593 can be an electrical interface routing between one socket or connection to another.

In some embodiments, the system 590 can include a controller 595 of a memory device (e.g., DRAM 591, NAND memory device 592, etc.) coupled to an output of a conductive node induction apparatus 100. As described further herein, the conductive node induction apparatus 100 includes a first layer comprising a first conductive material coupled to an interposer 593 of the memory device, a second layer proximate to the first layer comprising a first plurality of conductive traces coupling a corresponding first conductive edge of a first plurality of conductive nodes to a corresponding second conductive edge of a second plurality of conductive nodes, a third layer proximate to the second layer comprising a second plurality of conductive traces coupling a corresponding third edge of the first plurality of conductive nodes to a corresponding fourth edge of the second plurality of conductive nodes, and a fourth layer proximate to the third layer comprising a second conductive material. In this specific example, the conductive node induction apparatus 100 is configured to receive signaling having a first voltage value associated therewith, and apply, via the interposer 593, signaling having a second voltage value associated therewith to the controller 595. That is, the conductive node induction apparatus 100 can be embedded within a packaging substrate of the system 590.

In some embodiments, the conductive node induction apparatus 100 can be utilized by the boost converter 594 and/or charge pumps 597 to alter an input voltage to an increased output voltage. In some embodiments, the boost converter 594 includes the conductive node induction apparatus 100, a high-voltage metal-oxide semiconductor (MOS), and/or a controller 595. As described herein, the system 590 can have size constraints for the conductive node induction apparatus 100. In this way, the conductive node induction apparatus 100 described herein can be formed within the size constraints while still providing the induction levels and Q-factor that can be utilized by the system 590.

Although shown in a particular sequence or order, unless otherwise specified, the order of the methods can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

The figures herein follow a numbering convention in which the first digit or digits correspond to the drawing figure number and the remaining digits identify an element or component in the drawing. Similar (e.g., the same) elements or components between different figures may be identified by the use of similar digits. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present disclosure and should not be taken in a limiting sense.

As used herein, "a number of" or a "quantity of" something can refer to one or more of such things. For example, a number of or a quantity of turns can refer to one or more turns. A "plurality" of something intends two or more. As used herein, multiple acts being performed concurrently refers to acts overlapping, at least in part, over a particular time period. As used herein, the term "coupled" may include electrically coupled, directly coupled, and/or directly connected with no intervening elements (e.g., by direct physical contact), indirectly coupled and/or connected with intervening elements, or wirelessly coupled. The term coupled may further include two or more elements that co-operate or interact with each other (e.g., as in a cause and effect relationship). An element coupled between two elements can be between the two elements and coupled to each of the two elements. Unless stated otherwise, where a single element is discussed, it is understood that all similar elements are referred to.

It should be recognized the term planar accounts for variations from "exactly" planar due to routine manufacturing, measuring, and/or assembly variations and that one of ordinary skill in the art would know what is meant by the term "planar."

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

What is claimed is:

1. An induction apparatus, comprising:
   a first plurality of conductive nodes that include a corresponding first edge and second edge, wherein the first edge of the first plurality of conductive nodes are aligned with a first layer of a packaging substrate and the second edge of the first plurality of conductive nodes are aligned with a second layer of the packaging substrate;
   a second plurality of conductive nodes that include a corresponding first edge and second edge, wherein the first plurality of conductive nodes are separated from the second plurality of conductive nodes by a space, the first edge of the second plurality of conductive nodes are aligned with the first layer of the packaging substrate, and the second edge of the second plurality of conductive nodes are aligned with the second layer of the packaging substrate;
   a first conductive trace coupled to a first edge of a first conductive node of the first plurality of conductive nodes and coupled to a second edge of a first conductive node of the second plurality of conductive nodes; and
   a second conductive trace coupled to a first edge of the first conductive node of the second plurality of conductive nodes and coupled to a second edge of a second conductive node of the first plurality of conductive nodes.

2. The induction apparatus of claim 1, wherein the first conductive trace and the second conductive trace cross the space between the first plurality of conductive nodes and the second plurality of conductive nodes.

3. The induction apparatus of claim 1, wherein the first plurality of conductive nodes are aligned parallel to the second plurality of conductive nodes.

4. The induction apparatus of claim 1, wherein at least a portion of the first conductive trace intersects at least a portion of the second conductive trace through the space.

5. The induction apparatus of claim 1, wherein the space is between 1.0 millimeters and 2.0 millimeters.

6. A system, comprising:
   a controller of a memory device coupled to an output of an induction apparatus; and
   the induction apparatus, comprising:
      a first layer of a packaging substrate comprising a first conductive material coupled to an interposer of the memory device;
      a second layer of the packaging substrate proximate to the first layer comprising:
      a first plurality of conductive traces coupling a corresponding first edge of a first plurality of conductive nodes to a corresponding second edge of a second plurality of conductive nodes, wherein the first edge of the first plurality of conductive nodes are aligned with the first layer of the packaging substrate and, the second edge of the second plurality of conductive nodes are aligned with the first layer of the packaging substrate; and
      a second plurality of conductive traces coupling a corresponding third edge of the first plurality of conductive nodes to a corresponding fourth edge of the second plurality of conductive nodes, wherein the third edge of the first plurality of conductive nodes are aligned with the second layer of the packaging substrate and the fourth edge of the second plurality of conductive nodes are aligned with the second layer of the packaging substrate and the induction apparatus is configured to receive signaling having a first voltage value associated therewith; and
   apply, via the interposer, signaling having a second voltage value associated therewith to the controller.

7. The system of claim 6, wherein a Q factor of the induction apparatus is greater than 5.

8. The system of claim 6, wherein the first plurality of conductive traces have a width that is less than 100 micrometers.

9. The system of claim 6, wherein the first edge and the second edge are inverse edges and wherein the third edge and fourth edge are inverse edges.

10. The system of claim 6, wherein the first plurality of conductive nodes are substantially parallel to the second plurality of conductive nodes.

11. The system of claim 6, wherein the first layer is a ground layer that includes a plurality of apertures to reduce electromagnetic induction (EMI) radiation of the induction apparatus.

12. The system of claim 6, wherein the first plurality of conductive nodes each comprise the first edge and the third edge connected by a conductive material and the second plurality of conductive nodes each comprise the second edge and the fourth edge connected by the conductive material.

13. A method, comprising:
   forming a first set of conductive nodes that include a first conductive surface and a second conductive surface that is opposite to the first conductive surface;
   forming a second set of conductive nodes parallel to the first set of conductive nodes, wherein the second set of conductive nodes include a third conductive surface and a fourth conductive surface that is opposite the third conductive surface, wherein forming the second set of conductive nodes includes forming the third conductive surface at substantially the same height as the first conductive surface of the first set of conductive nodes and forming the fourth conductive surface at substantially the same height as the second conductive surface of the first set of conductive nodes;
   forming a first set of conductive traces that connect the first conductive surface of the first set of conductive nodes to a corresponding fourth conductive surface of the second set of conductive nodes;
   forming a second set of conductive traces that connect the second conductive surface of the first set of conductive nodes to a corresponding third conductive surface of the second set of conductive nodes; and
   providing current through the first set of conductive traces and the second set of conductive traces to generate an inductance between the first set of conductive nodes and the second set of conductive nodes.

14. The method of claim 13, further comprising forming a ground layer parallel to the first conductive surface of the first set of conductive nodes and the third conductive surface of the second set of conductive nodes.

15. The method of claim 14, further comprising forming a plurality of apertures within the ground layer.

16. The method of claim 13, further comprising forming a conductive coil with the first set of conductive traces and the second set of conductive traces between a first height of the first set of conductive nodes and a second height of the second set of conductive nodes.

17. The method of claim 13, further comprising forming the first set of conductive nodes by:
   forming the first conductive surface with a first diameter;
   forming the second conductive surface with the first diameter; and
   forming a conductive connection between the first conductive surface and the second conductive surface with a second diameter that is smaller than the first diameter.

* * * * *